United States Patent
Lin et al.

(10) Patent No.: US 9,087,847 B2
(45) Date of Patent: *Jul. 21, 2015

(54) THERMALLY ENHANCED INTERCONNECT SUBSTRATE WITH EMBEDDED SEMICONDUCTOR DEVICE AND BUILT-IN STOPPER AND METHOD OF MAKING THE SAME

(71) Applicant: Bridge Semiconductor Corporation, Taipei (TW)

(72) Inventors: Charles W. C. Lin, Singapore (SG); Chia-Chung Wang, Hsinchu (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 11 days.

This patent is subject to a terminal disclaimer.

(21) Appl. No.: 13/753,570

(22) Filed: Jan. 30, 2013

(65) Prior Publication Data

US 2014/0048949 A1    Feb. 20, 2014

Related U.S. Application Data

(63) Continuation-in-part of application No. 13/733,226, filed on Jan. 3, 2013, and a continuation-in-part of application No. 13/738,314, filed on Jan. 10, 2013.

(60) Provisional application No. 61/682,801, filed on Aug. 14, 2012.

(51) Int. Cl.
  *H01L 23/48* (2006.01)
  *H01L 23/538* (2006.01)
  (Continued)

(52) U.S. Cl.
  CPC ........ *H01L 23/5389* (2013.01); *H01L 23/3128* (2013.01); *H01L 23/367* (2013.01); *H01L 24/20* (2013.01); *H01L 24/24* (2013.01); *H01L 24/82* (2013.01); *H01L 24/83* (2013.01); *H01L 24/92* (2013.01); *H01L 24/32* (2013.01);
  (Continued)

(58) Field of Classification Search
  CPC ..... H01L 23/48; H01L 23/485; H01L 23/552; H01L 23/34; H01L 23/498
  USPC ......... 257/774, 659, 737, 738, 773, 758, 760, 257/622, 635
  See application file for complete search history.

(56) References Cited

U.S. PATENT DOCUMENTS 3,691,628 A   9/1972   Kim et al.
5,073,814 A   12/1991  Cole, Jr. et al.
(Continued)

*Primary Examiner* — Chuong A Luu
(74) *Attorney, Agent, or Firm* — Bacon & Thomas, PLLC

(57) ABSTRACT

The present invention relates to a thermally enhanced interconnect substrate and a method of making the same. In accordance with one preferred embodiment, the method includes: forming a stopper on a metal layer of a laminate substrate; removing a selected portion of the metal layer to form a paddle layer; mounting a semiconductor device on the paddle layer using the stopper as a placement guide for the semiconductor device; attaching a stiffener to the laminate substrate; forming first and second build-up circuitries that cover the semiconductor device, the paddle layer and the stiffener at both sides; and providing a plated through-hole that provides an electrical connection between the first and second build-up circuitries. Accordingly, the paddle layer can provide excellent heat spreading, and the stopper can accurately confine the placement location of the semiconductor device and avoid the electrical connection failure between the semiconductor device and the build-up circuitry.

6 Claims, 10 Drawing Sheets

(51) Int. Cl.
  H01L 23/31 (2006.01)
  H01L 23/367 (2006.01)
  H01L 23/00 (2006.01)
  H01L 25/065 (2006.01)
  H01L 25/00 (2006.01)

(52) U.S. Cl.
  CPC ............ *H01L 25/0657* (2013.01); *H01L 25/50* (2013.01); *H01L 2224/16145* (2013.01); *H01L 2224/16225* (2013.01); *H01L 2224/211* (2013.01); *H01L 2224/24227* (2013.01); *H01L 2224/32135* (2013.01); *H01L 2224/32225* (2013.01); *H01L 2224/48091* (2013.01); *H01L 2224/48227* (2013.01); *H01L 2224/48228* (2013.01); *H01L 2224/73265* (2013.01); *H01L 2224/73267* (2013.01); *H01L 2224/821* (2013.01); *H01L 2224/8203* (2013.01); *H01L 2224/8314* (2013.01); *H01L 2224/83855* (2013.01); *H01L 2224/92244* (2013.01); *H01L 2924/15153* (2013.01)

(56) References Cited

U.S. PATENT DOCUMENTS

| | | | |
|---|---|---|---|
| 5,161,093 A | 11/1992 | Gorczyca et al. | |
| 5,353,498 A | 10/1994 | Fillion et al. | |
| 5,422,513 A | 6/1995 | Marcinkiewicz et al. | |
| 5,745,984 A | 5/1998 | Cole, Jr. et al. | |
| 6,154,366 A | 11/2000 | Ma et al. | |
| 6,271,469 B1 | 8/2001 | Ma et al. | |
| 6,507,102 B2 | 1/2003 | Juskey et al. | |
| 6,528,882 B2 | 3/2003 | Ding et al. | |
| 6,670,219 B2 | 12/2003 | Lee et al. | |
| 6,709,898 B1 | 3/2004 | Ma et al. | |
| 6,713,859 B1 | 3/2004 | Ma | |
| 6,825,063 B2 | 11/2004 | Vu et al. | |
| 6,861,720 B1 | 3/2005 | Heckman et al. | |
| 6,865,084 B2 | 3/2005 | Lin et al. | |
| 6,965,157 B1 | 11/2005 | Perez et al. | |
| 7,019,406 B2 | 3/2006 | Huang et al. | |
| 7,038,311 B2 | 5/2006 | Woodall et al. | |
| 7,364,944 B2 | 4/2008 | Huang et al. | |
| 7,405,103 B2 | 7/2008 | Chang | |
| 7,579,217 B2 | 8/2009 | Zhao et al. | |
| 7,629,681 B2 | 12/2009 | Zhao et al. | |
| 7,935,893 B2 | 5/2011 | Tanaka et al. | |
| 7,944,039 B2 | 5/2011 | Arai | |
| 7,999,401 B2 | 8/2011 | Murai et al. | |
| 8,026,590 B2 | 9/2011 | Kang et al. | |
| 8,119,454 B2 | 2/2012 | Jin | |
| 2007/0290366 A1* | 12/2007 | Cheng | 257/778 |
| 2009/0215231 A1* | 8/2009 | Inoue | 438/125 |
| 2010/0062564 A1* | 3/2010 | Sakaguchi et al. | 438/106 |
| 2010/0184256 A1 | 7/2010 | Chino | |
| 2011/0289773 A1 | 12/2011 | Tanaka et al. | |
| 2012/0000068 A1 | 1/2012 | Sakamoto et al. | |
| 2012/0119391 A1 | 5/2012 | Koizumi et al. | |
| 2012/0120609 A1 | 5/2012 | Chou et al. | |
| 2012/0217627 A1 | 8/2012 | Tseng et al. | |
| 2012/0228764 A1 | 9/2012 | Tseng et al. | |
| 2014/0048944 A1* | 2/2014 | Lin et al. | 257/773 |

* cited by examiner

THERMALLY ENHANCED INTERCONNECT SUBSTRATE WITH EMBEDDED SEMICONDUCTOR DEVICE AND BUILT-IN STOPPER AND METHOD OF MAKING THE SAME

CROSS REFERENCE TO RELATED APPLICATION

This application is a continuation-in-part of U.S. application Ser. No. 13/733,226 filed Jan. 3, 2013 and a continuation-in-part of U.S. application Ser. No. 13/738,314 filed Jan. 10, 2013, each of which is incorporated by reference. This application also claims the benefit of filing date of U.S. Provisional Application Ser. No. 61/682,801, entitled "Structure and Manufacture of Semiconductor Assembly and 3D Stacking thereof" filed Aug. 14, 2012 under 35 USC §119(e)(1).

U.S. application Ser. No. 13/733,226 filed Jan. 3, 2013 and U.S. application Ser. No. 13/738,314 filed Jan. 10, 2013 all claim the benefit of filing date of U.S. Provisional Application Ser. No. 61/682,801 filed Aug. 14, 2012.

BACKGROUND OF THE INVENTION

1. Field of the Invention

The present invention relates to a thermally enhanced interconnect substrate for a semiconductor assembly and a method of making the same, and more particularly to a thermally enhanced interconnect substrate with embedded semiconductor device and built-in stopper and a method of making the same.

2. Description of Related Art

As market trend demands for thinner, smarter and cheaper portable electronics, semiconductor devices for use in these equipments are required to further shrink their size and improve electrical performances at lower cost. Among all the efforts, embedding or built-in semiconductor chip in printed wiring board to form a module assembly is considered the most effective approach since it can drastically reduce the overall weight, thickness and improve electrical performance through a shorten interconnect distance.

However, the attempt of embedding chip in a wiring board can encounter many problems. For example, the chip to be embedded is known to vertically and laterally shift during die attach and encapsulation/lamination processes due to thermal characteristics of plastic materials. The CTE mismatch between metal, dielectric and silicon at various stages of thermal treatment can result in misalignment of the build-up interconnect structure to be deposited thereon. U.S. Pat. No. 7,935,893 to Tanaka et. al., U.S. Pat. No. 7,944,039 to Aral and U.S. Pat. No. 7,405,103 to Chang disclose various alignment methods to address manufacturing yield concern. None of these approaches offers a proper solution or effective method for controlling die movement because the underneath adhesive will reflow during curing and therefore dislocates the attached die from the pre-determined location even a highly precise alignment mark and equipment are applied. U.S. Patent Application 2010/0184256 to Chino discloses a resin sealing method to fix the semiconductor device adhered to the adhesive layer formed on the support body. This approach may be effective in controlling die from further movement during sealing process, it does not provide any control or adjustment for die attach process and the misregistration is unavoidable due to die attach adhesive reflows.

SUMMARY OF THE INVENTION

The present invention has been developed in view of such a situation, and an object thereof is to provide a thermally enhanced interconnect substrate with dual build-up circuitries in which a semiconductor device is precisely affixed at a predetermined location by a stopper, a paddle layer can provide a thermally conductive pathway, warp and bend of the semiconductor device can be suppressed, and electrical connection between the semiconductor device and the build-up circuitry can be securely retained by conductive via.

In one preferred embodiment, the present invention provides a method of making a thermally enhanced interconnect substrate, which includes the following steps: forming a stopper on a metal layer of a laminate substrate that includes the metal layer and a dielectric layer; removing a selected portion of the metal layer to define a remaining portion of the metal layer as a paddle layer and expose a selected portion of the dielectric layer; mounting a semiconductor device on the paddle layer using the stopper as a placement guide for the semiconductor device that includes an active surface with a contact pad thereon and an inactive surface, wherein the active surface faces a first vertical direction, the inactive surface faces a second vertical direction opposite the first vertical direction and is attached to the paddle layer, and the stopper extends from the paddle layer in the first vertical direction and is located in close proximity to and laterally aligned with and laterally extends beyond peripheral edges of the semiconductor device in lateral directions orthogonal to the vertical directions; attaching a stiffener to the laminate substrate, including aligning the semiconductor device and the stopper within an aperture of the stiffener; forming a first build-up circuitry that covers the stopper, the semiconductor device and the stiffener in the first vertical direction and includes a first conductive via that directly contacts the contact pad of the semiconductor device to provide an electrical connection between the semiconductor device and the first build-up circuitry; forming a second build-up circuitry that includes the dielectric layer and covers the stiffener and the paddle layer in the second vertical direction; and providing a plated through-hole that extends through the stiffener in the vertical directions to provide an electrical connection between the first build-up circuitry and the second build-up circuitry.

In another preferred embodiment, the present invention provides another method of making a thermally enhanced interconnect substrate, which includes the following steps: forming a stopper on a metal layer; mounting a semiconductor device on the metal layer using the stopper as a placement guide for the semiconductor device that includes an active surface with a contact pad thereon and an inactive surface, wherein the active surface faces a first vertical direction, the inactive surface faces a second vertical direction opposite the first vertical direction and is attached to the metal layer, and the stopper extends from the metal layer in the first vertical direction and is located in close proximity to and laterally aligned with and laterally extends beyond peripheral edges of the semiconductor device in lateral directions orthogonal to the vertical directions; attaching a stiffener to the metal layer, including aligning the semiconductor device and the stopper within an aperture of the stiffener; forming an opening that extends through the metal layer; forming a first build-up circuitry that covers the stopper, the semiconductor device and the stiffener in the first vertical direction and includes a first conductive via that directly contacts the contact pad of the semiconductor device to provide an electrical connection between the semiconductor device and the first build-up circuitry; forming a second build-up circuitry that covers the stopper, the semiconductor device, the stiffener and the metal layer in the second vertical direction; and providing a plated through-hole that is aligned with the opening of the metal layer and extends through the stiffener in the vertical directions to provide an electrical connection between the first build-up circuitry and the second build-up circuitry.

The method of making a thermally enhanced interconnect substrate according to the present invention can further include: forming a placement guide on the dielectric layer or the metal layer. For instance, in removing a selected portion of the metal layer, another selected portion of the metal layer may remain on the dielectric layer and serve as the placement guide. Alternatively, the placement guide can be simultaneously formed on the metal layer during forming the stopper on the metal layer. Accordingly, attaching the stiffener to the laminate substrate or the metal layer can include: aligning the semiconductor device and the stopper within the aperture of the stiffener with the placement guide being in close proximity to and laterally aligned with and laterally extending beyond the outer peripheral edges of the stiffener in lateral directions.

Forming the stopper and the placement guide can include photolithographic process. By photolithography, the stopper and the placement guide can be designed into various patterns to avoid undesirable movement of the semiconductor device and the stiffener, thereby improving the manufacturing yield greatly.

The laminate substrate can optionally further include a support plate, and the dielectric layer can be sandwiched between the metal layer and the support plate. Optionally, the method of making an interconnect substrate according to the present invention can further include: removing the support plate or thinning the support plate after mounting the semiconductor device and attaching the stiffener.

In the above methods which use the metal layer as a paddle layer for device attachment, the semiconductor device can be attached to the paddle layer using an adhesive that contacts and is sandwiched between the semiconductor device and the paddle layer. Likewise, the stiffener can be attached to the laminate substrate or the metal layer using an adhesive that contacts and is sandwiched between the stiffener and the laminate substrate or the metal layer. In any case, the adhesive can contact and be coplanar with the stopper and the placement guide in the second vertical direction and lower than the stopper and the placement guide in the first vertical direction. As a result, the semiconductor device can be affixed and mechanically connected to the paddle layer at predetermined location defined by the stopper that extends from the paddle layer and extends beyond the inactive surface of the semiconductor device in the first vertical direction. Likewise, the stiffener can be affixed and mechanically connected to the metal layer or the laminate substrate at predetermined location defined by the placement guide that extends from the metal layer or the dielectric layer and extends beyond the attached surface of the stiffener in the first vertical direction. As the adhesive is lower than the stopper and the placement guide in the first vertical direction, the stopper and the placement guide can stop the undesirable movement of the semiconductor device and the stiffener during curing the adhesive.

The first build-up circuitry can include a first insulating layer and one or more first conductive traces, while the second build-up circuitry can include a second insulating layer and one or more second conductive traces. For instance, the first insulating layer covers the semiconductor device, the stopper and the stiffener in the first vertical direction and the first conductive traces extend from the first insulating layer in the first vertical direction, while the second insulating layer covers the paddle layer and the stiffener in the second vertical direction and the second conductive traces extend from the second insulating layer in the second vertical direction. As a result, forming the first build-up circuitry and the second build-up circuitry can include: providing a first insulating layer that covers the stopper, the semiconductor device and the stiffener in the first vertical direction; providing a second insulating layer that covers the paddle layer and the stiffener in the second vertical direction; forming one or more first via openings that extend through the first insulating layer and are aligned with one or more contact pads of the semiconductor device and optionally one or more additional first via openings that extend through the first insulating layer and are aligned with the stiffener; optionally forming one or more second via openings that extend through the second insulating layer and are aligned with the paddle layer or/and the stiffener; forming one or more first conductive traces that extend from the first insulating layer in the first vertical direction and extend laterally on the first insulating layer and extend through the first via openings in the second vertical direction to form one or more first conductive vias in direct contact with the contact pads of the semiconductor device and optionally one or more additional first conductive vias in direct contact with the stiffener; and forming one or more second conductive trace that extend from the second insulating layer in the second vertical direction and extend laterally on the second insulating layer and optionally extend through the second via openings in the first vertical direction to form one or more second conductive vias in direct contact with the paddle layer or/and the stiffener. Accordingly, the first conductive traces can directly contact the contact pads to provide signal routing for the semiconductor device, and thus the electrical connection between the semiconductor device and the first build-up circuitry can be devoid of solder. Besides, the second conductive traces can directly contact the paddle layer to provide thermal dissipation pathway for the semiconductor device. The first and second conductive traces can also directly contact the stiffener for grounding or electrical connections to passive components such as thin film resistors or capacitors deposited thereon.

The first and second build-up circuitries can further include additional insulating layers, additional via openings, and additional conductive traces if needed for further signal routing. For instance, the first build-up circuitry can further include a third insulating layer, one or more third via openings and one or more third conductive traces. The third insulating layer can extend from the first insulating layer and the first conductive trace in the first vertical direction and can extend to peripheral edges of the interconnect substrate, and the third conductive traces extend from the third insulating layer in the first vertical direction. As a result, forming the first build-up circuitry can further include: providing a third insulating layer on the first insulating layer and the first conductive trace that extends from the first insulating layer and the first conductive trace in the first vertical direction; then forming one or more third via openings that extend through the third insulating layer and are aligned with the first conductive trace; and then forming one or more third conductive traces that extend from the third insulating layer in the first vertical direction and extend laterally on the third insulating layer and extend through the third via openings in the second vertical direction to form one or more third conductive vias in direct contact with the first conductive traces, thereby electrically connecting the first conductive trace to the third conductive traces. Likewise, the second build-up circuitry can further include a fourth insulating layer, one or more fourth via openings and one or more fourth conductive traces. The fourth insulating layer can extend from the second insulating layer and the second conductive trace in the second vertical direction and can extend to peripheral edges of the interconnect substrate, and the fourth conductive traces extend from the fourth insulating layer in the second vertical direction. As a result, providing the second build-up circuitry can further include: providing a fourth insulating layer on the second insulating layer and the second conductive trace that extends from the second insulating layer and the second conductive trace in the second vertical direction; then forming one or more fourth via openings that extend through the fourth insulating layer and are aligned with the second conductive trace; and then forming one or more fourth conductive traces that extend from the fourth insulating layer in the second vertical direction and extend laterally on the fourth insulating layer and extend through the fourth via openings in the first vertical direction to form one or more fourth conductive vias in direct contact with the second conductive traces, thereby electrically connecting the second conductive trace to the fourth conductive traces.

The first and second via openings can be simultaneously formed, and the first and second conductive traces can be simultaneously deposited and patterned. Likewise, the third and fourth via openings can be simultaneously formed, and the third and fourth conductive traces can be simultaneously deposited and patterned. The first, second, third and fourth via openings can have the same size. The first and third insulating layers and conductive traces can have flat elongated surfaces that face in the first vertical direction, while the second and fourth insulating layers and conductive traces can have flat elongated surfaces that face in the second vertical direction.

The outmost conductive traces of the first and second build-up circuitries can respectively include one or more first and second interconnect pads to provide electrical contacts for the next level assembly or another electronic device such as a semiconductor chip, a plastic package or another semiconductor assembly. The first interconnect pads can include an exposed contact surface that faces in the first vertical direction, while the second interconnect pads can include an exposed contact surface that faces in the second vertical direction. As a result, the interconnect substrate can include electrical contacts (i.e. the first and second interconnect pads) that are electrically connected to one another and located on opposite surfaces that face in opposite vertical directions, so that the interconnect substrate with embedded semiconductor device is stackable and the next level assembly or another electronic device can be electrically connected to the embedded semiconductor device using a wide variety of connection media including wire bonding or solder bumps as the electrical contacts. Besides, the second build-up circuitry may further include a die paddle that extends from the outmost insulating layer of the second build-up circuitry and has an exposed contact surface that faces in the second vertical direction. For instance, the die paddle can extend from the second insulating layer in the second vertical direction and be integral with second conductive vias in the second insulating layer. Accordingly, another electronic device can be mounted on the die paddle and be electrically connected to the outmost conductive trace of the second build-up circuitry by wire bonding or solder bumps.

Providing the plated through-hole can include forming a through-hole that extends through the stiffener and the dielectric layer in the vertical directions, and then depositing a connecting layer on an inner sidewall of the through-hole.

The plated through-hole can be provided during providing the first build-up circuitry and the second build-up circuitry. For instance, providing the plated through-hole can include forming a through-hole that extends through the stiffener and the insulating layers (e.g. extends through the first and second insulating layers, or extends through the first, second, third and fourth insulating layers) in the vertical directions after providing the insulating layers and then depositing a connecting layer on an inner sidewall of the through-hole during depositing the conductive traces (e.g. the first conductive trace/the second conductive trace or the third conductive trace/the fourth conductive trace).

The insulating layers can be deposited and extend to peripheral edges of the interconnect substrate by numerous techniques including film lamination, roll coating, spin coating and spray-on deposition. The via openings can be formed through the insulating layers by numerous techniques including laser drilling, plasma etching and photolithography. The conductive traces can be formed by depositing a plated layer that covers the insulating layer and extends through the via opening and then removing selected portions of the plated layer using an etch mask that defines the conductive trace. The plated layers and the connecting layer can be deposited by numerous techniques including electroplating, electroless plating, evaporating, sputtering, and their combinations as a single layer or multiple layers. The plated layers can be patterned by numerous techniques including wet etching, electro-chemical etching, laser-assist etching, and their combinations to define the conductive traces.

By the above-mentioned method, the present invention can provide a thermally enhanced interconnect substrate that includes: a paddle layer; a semiconductor device that is mounted on the paddle layer from a first vertical direction and includes an active surface with a contact pad thereon and an inactive surface, wherein the active surface faces the first vertical direction and the inactive surface faces a second vertical direction opposite the first vertical direction and is attached to the paddle layer; a stopper that extends from the paddle layer in the first vertical direction and serves as a placement guide for the semiconductor device and is in close proximity to and laterally aligned with and laterally extends beyond peripheral edges of the semiconductor device in lateral directions orthogonal to the vertical directions; a stiffener that includes an aperture with the semiconductor device and the stopper extending thereinto; a first build-up circuitry that covers the stopper, the semiconductor device and the stiffener in the first vertical direction and includes a first insulating layer, one or more first via openings and one or more first conductive traces, wherein the first via openings in the first insulating layer are aligned with the contact pads of the semiconductor device and optionally the stiffener, and the first conductive traces extend from the first insulating layer in the first vertical direction and extend through the first via openings in the second vertical direction and directly contact the contact pads and optionally the stiffener; a second build-up circuitry that covers the paddle layer and the stiffener in the second vertical direction and includes a second insulating layer, optionally one or more second via openings and one or more second conductive traces, wherein the second via openings in the second insulating layer are aligned with the paddle layer and/or the stiffener, and the second conductive trace extend from the second insulating layer in the second vertical direction and optionally extend through the second via openings in the first vertical direction; and a plated through-hole that extends through the stiffener in the vertical directions to provide an electrical connection between the first build-up circuitry and the second build-up circuitry. Optionally, the interconnect substrate can further include: a placement guide that is in close proximity to and laterally aligned with and laterally extends beyond the outer peripheral edges of the stiffener in lateral directions orthogonal to the vertical directions.

The stopper and the placement guide can be made of a metal such as copper, aluminum, nickel, iron, tin or alloys and have patterns against undesirable movement of the semiconductor device and the stiffener, respectively. For instance, the stopper and the placement guide can include a continuous or discontinuous strip or an array of posts. The stopper and the placement guide can be simultaneously formed and have the same or different patterns. Specifically, the stopper can be laterally aligned with four lateral surfaces of the semiconductor device to stop the lateral displacement of the semiconductor device. For instance, the stopper can be aligned along and conform to four sides, two diagonal corners or four corners of the semiconductor device and a gap in between the semiconductor device and the stopper preferably is in a range of about 0.001 to 1 mm. The semiconductor device can be spaced from the inner wall of the aperture by the stopper, and a bonding material can be added between the semiconductor device and the stiffener to enhance rigidity or the first insulating layer of the build-up circuitry may extend into and fill the gap between the semiconductor device and the stiffener. Moreover, the stopper can also be in close proximity to and laterally aligned with the inner wall of the aperture to stop the lateral displacement of the stiffener. Likewise, the placement guide can be laterally aligned with four outer lateral surfaces of the stiffener to stop the lateral displacement of the stiffener. For instance, the placement guide can be aligned along and conform to four outer sides, two outer diagonal corners or four outer corners of the stiffener and a gap in between the outer peripheral edges of the stiffener and the placement guide preferably is in a range of about 0.001 to 1 mm. Besides, the stopper and the placement guide preferably have a thickness in a range of 10-200 microns.

The paddle layer can be a thermally conductive metal plate such as copper with a thickness of 10-200 microns and can be spaced from or extend to peripheral edges of the interconnect substrate. The paddle layer can be thermally connected to an outer conductive layer of the build-up circuitry by metallized thermal vias that serve as heat pipes. For instance, the paddle layer can be thermally connected to the outer layer of the second build-up circuitry by second and fourth conductive traces in second and fourth via openings. In this manner, the paddle layer can enhance the thermal performance of the interconnect substrate.

The stiffener can extend to peripheral edges of the interconnect substrate and provide mechanical support to suppress warp and bend of the semiconductor device. Moreover, the stiffener also can provide ground/power plane and heat sink for the build-up circuitry. The stiffener can be a single layer structure or a multi-layer structure (such as a circuit board or a multi-layer ceramic board or a laminate of a substrate and a conductive layer). For instance, the stiffener can be made of ceramics or other various inorganic materials, such as aluminum oxide ($Al_2O_3$), aluminum nitride (AlN), silicon nitride (SiN), silicon (Si), glass, etc. The stiffener can also be made of organic materials such as laminated epoxy, polyimide or copper-clad laminate.

The semiconductor device can be a packaged or unpackaged semiconductor chip. For instance, the semiconductor device can be a land grid array (LGA) package or wafer level package (WLP) that includes a semiconductor chip. Alternatively, the semiconductor device can be a semiconductor chip.

The interconnect substrate with embedded semiconductor device can be further used for first-level or second-level semiconductor assembly. For instance, a single chip or multiple chips can be assembled to the substrate and form a three dimensional stacked package. Alternatively, the interconnect substrate with embedded device can be further used for a second-level assembly wherein a single package such as BGA or multiple packages can be soldered onto the substrate and form a three dimensional stacked module.

Unless specific descriptions or using the term "then" between steps or steps necessarily occurring in a certain order, the sequence of the above-mentioned steps is not limited to that set forth above and may be changed or reordered according to desired design.

The present invention has numerous advantages. The stiffener can provide a power/ground plane, a heat sink and a robust mechanical support for the semiconductor device and the build-up circuitry. The stopper can accurately confine the placement location of the semiconductor device and avoid the electrical connection failure between the semiconductor device and the build-up circuitry resulted from the lateral displacement of the semiconductor device, thereby improving the manufacturing yield greatly. The paddle layer can provide excellent heat spreading, thereby enhancing thermal performance. The direct electrical connection without solder between the semiconductor device and the build-up circuitry is advantageous to high I/O and high performance. The plated through-hole can provide vertical signal routing between the two build-up circuitries with respective interconnect pads at both sides of the interconnect substrate, thereby providing the next level semiconductor assembly with device-on-device stacking feature. The interconnect substrate made by this method is reliable, inexpensive and well-suited for high volume manufacture.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENT

Hereafter, examples will be provided to illustrate the embodiments of the present invention. Other advantages and effects of the invention will become more apparent from the disclosure of the present invention. It should be noted that these accompanying figures are simplified. The quantity, shape and size of components shown in the figures may be modified according to practically conditions, and the arrangement of components may be more complex. Other various aspects also may be practiced or applied in the invention, and various modifications and variations can be made without departing from the spirit of the invention based on various concepts and applications.

Embodiment 1

Figure 1:
FIGS. 1 and 2 are cross-sectional views showing a method of forming a stopper on a metal layer in accordance with an embodiment of the present invention.
Figure 2:
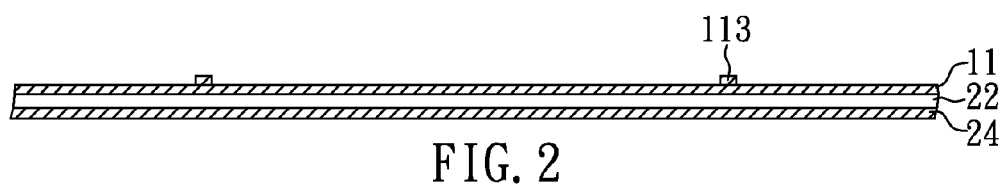
Figure 2A:
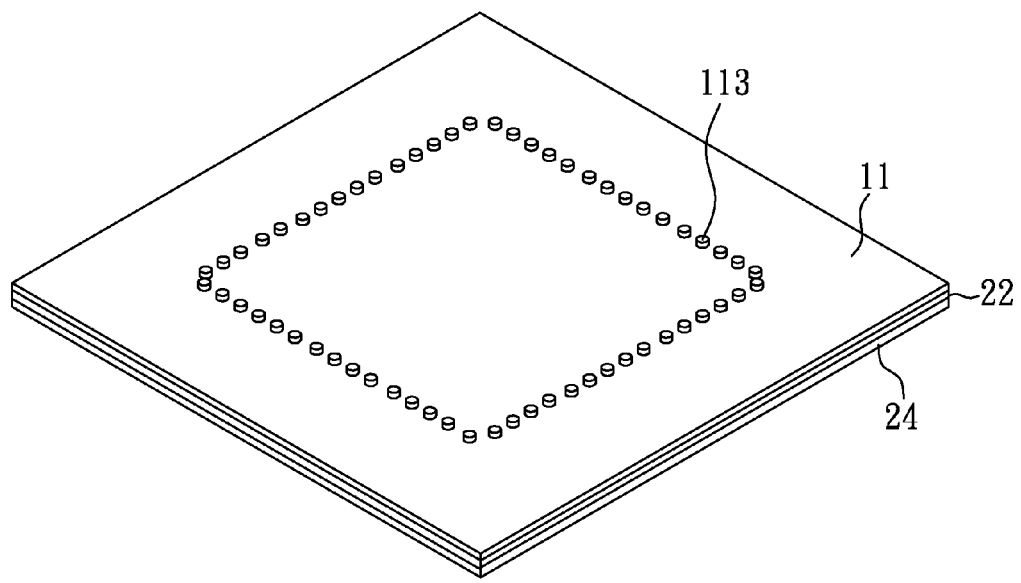
FIG. 2A is a top view corresponding to FIG. 2.

FIGS. 1 and 2 are cross-sectional views showing a method of forming a stopper on a metal layer in accordance with an embodiment of the present invention, and FIG. 2A is a top view corresponding to FIG. 2.

FIG. 1 is a cross-sectional view of a laminate substrate that includes metal layer 11, dielectric layer 22 and support plate 24. Metal layer 11 is illustrated as a copper layer with a thickness of 35 microns. However, metal layer 11 can also be made of other various metal materials and is not limited to a copper layer. Besides, metal layer 11 can be deposited on dielectric layer 22 by numerous techniques including lamination, electroplating, electroless plating, evaporating, sputtering, and their combinations as a single layer or multiple layers, and preferably has a thickness in a range of 10 to 200 microns.

Dielectric layer 22 typically is made of epoxy resin, glass-epoxy, polyimide and the like and has a thickness of 50 microns. In this embodiment, dielectric layer 22 is sandwiched between metal layer 11 and support plate 24. However, support plate 24 may be omitted in some embodiments. Support plate 24 typically is made of copper, but copper alloys or other materials are also doable. The thickness of support plate 24 can range from 25 to 1000 microns, and preferably ranges from 35 to 100 microns in consideration of process and cost. In this embodiment, support plate 24 is illustrated as a copper plate with a thickness of 35 microns.

FIGS. 2 and 2A are cross-sectional and top views, respectively, of the structure with stopper 113 formed on metal layer 11. Stopper 113 can be formed by electrolytic plating of metal on metal layer 11 using photolithographic process. In this illustration, stopper 113 consists of plural metal posts in a rectangular frame array with a thickness of 35 microns and conforms to four sides of a semiconductor device subsequently disposed on metal layer 11. However, stopper patterns are not limited thereto and can be other various patterns against undesirable movement of the subsequently disposed semiconductor device.

Figure 2B:
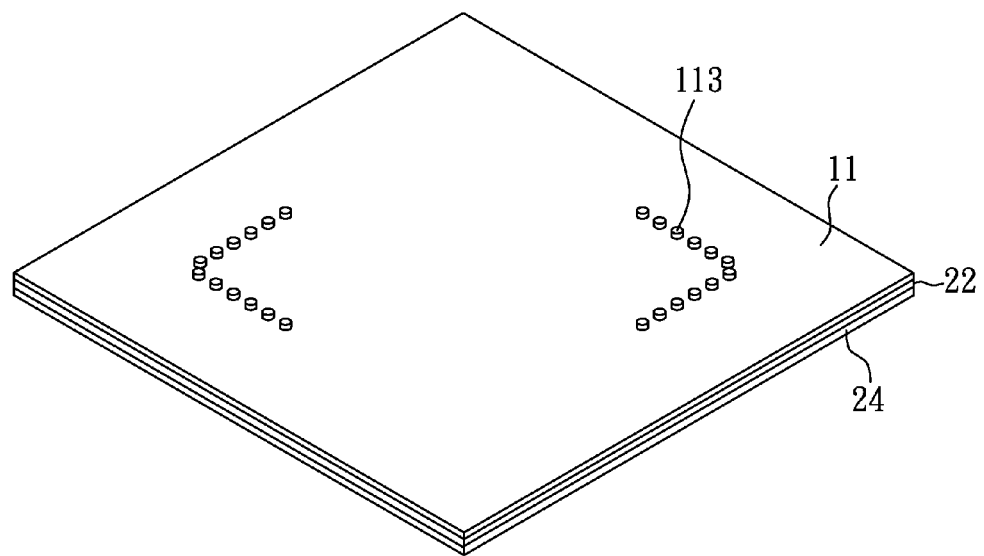
FIGS. 2B-2F are top views of various stopper patterns that can be practiced in the present invention.
Figure 2C:
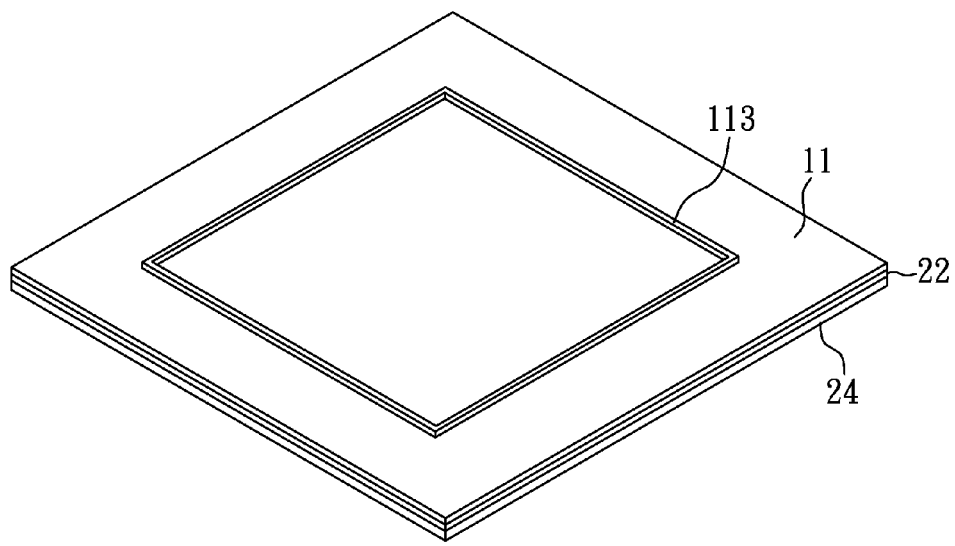
Figure 2D:
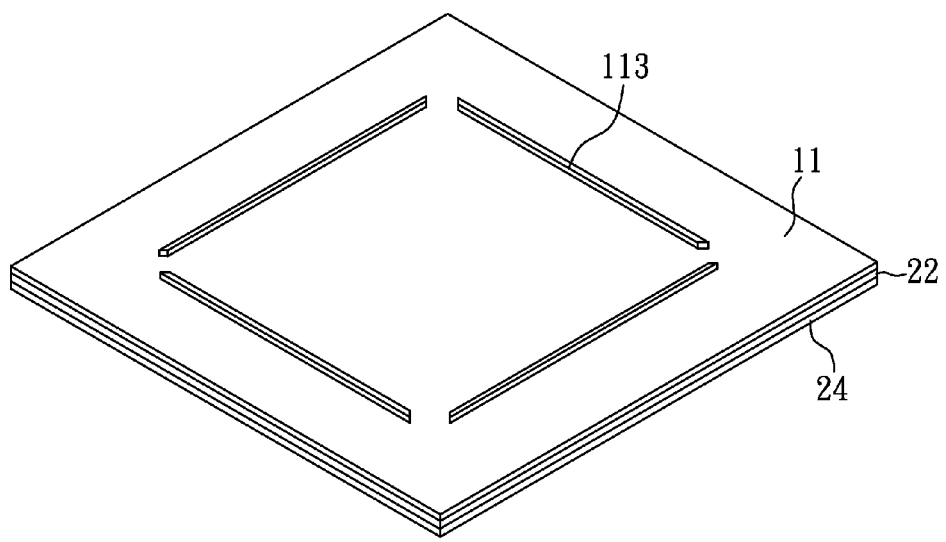
Figure 2E:
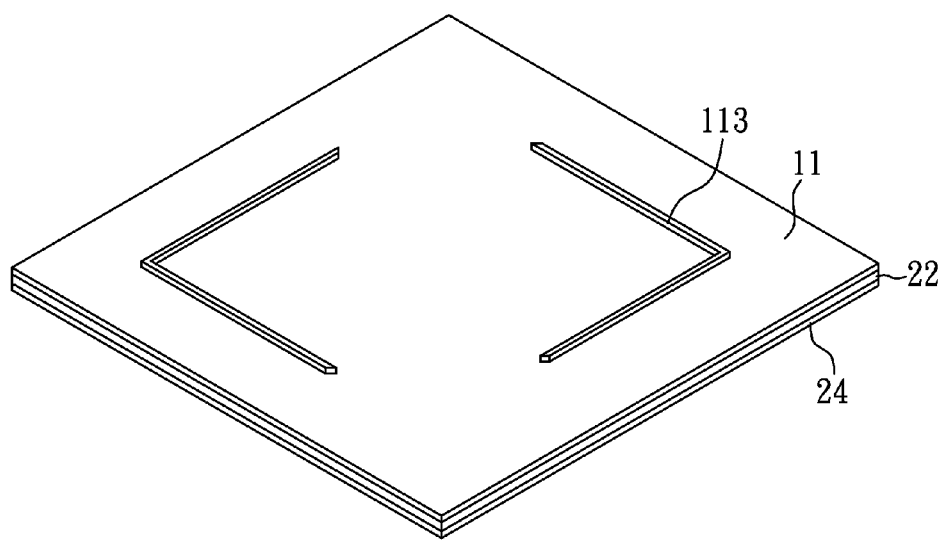
Figure 2F:
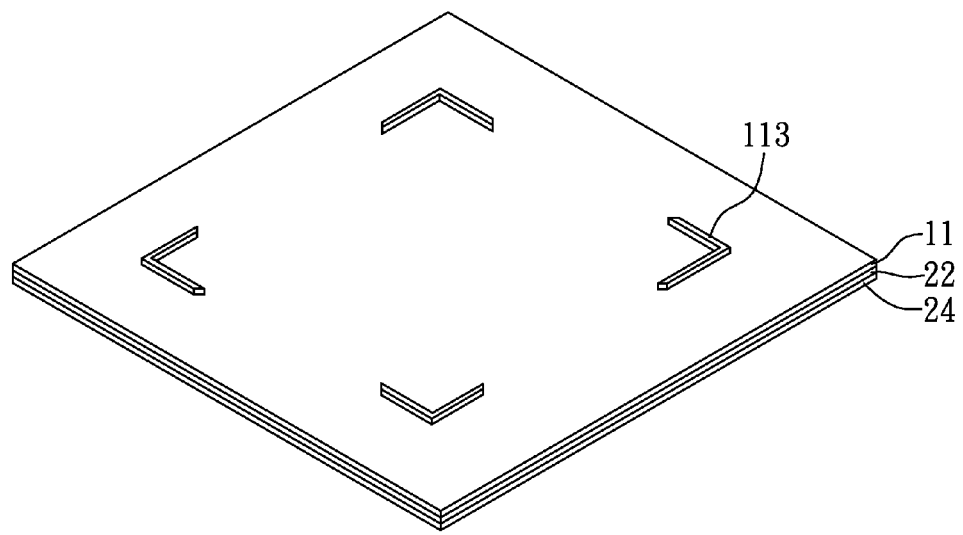

FIGS. 2B-2F are top views of other various stopper patterns for reference. For instance, as shown in FIG. 2B, stopper 113 may conform to two diagonal corners of a subsequently disposed semiconductor device. Alternatively, as shown in FIGS. 2C-2F, stopper 113 may consist of a continuous or discontinuous strip and conform to four sides (FIGS. 2C and 2D), two diagonal corners (FIG. 2E) or four corners (FIG. 2F) of a subsequently disposed semiconductor device.

FIGS. 3-8 are cross-sectional views showing a method of making an interconnect substrate that includes a semiconductor device, a stopper, a stiffener, a paddle layer, a plated through hole, and dual build-up circuitries in accordance with an embodiment of the present invention.

Figure 8:
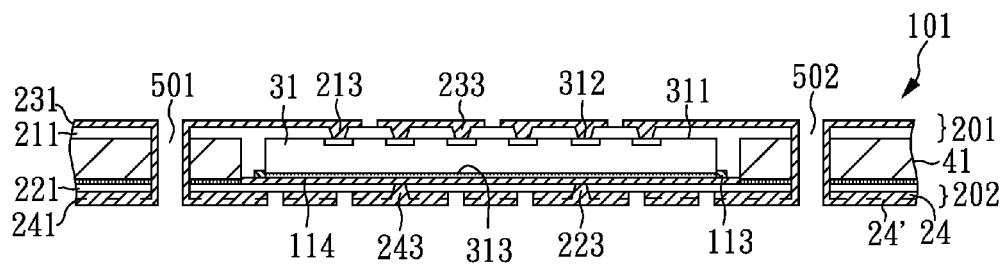

As shown in FIG. 8, interconnect substrate 101 includes semiconductor device 31, stopper 113, paddle layer 114, stiffener 41, plated through-hole 502 and dual build-up circuitries 201, 202. Semiconductor device 31 includes active surface 311, inactive surface 313 opposite to active surface 311, and contact pads 312 at active surface 311. Paddle layer 114 is sandwiched between inactive surface 313 of semiconductor device 31 and second build-up circuitry 202 and serves as a heat spreader. First build-up circuitry 201 is electrically connected to contact pads 312 of semiconductor device 31 and includes first insulating layer 211 and first conductive traces 231, while second build-up circuitry 202 is electrically connected to the first build-up circuitry 201 via plated through-hole 502 and includes second insulating layer 221 and second conductive traces 241. Stopper 113 extends from paddle layer 114 in the upward direction and is in close proximity to peripheral edges of semiconductor device 31. Stopper 113 as well as semiconductor device 31 are aligned with and extend into aperture 411 of stiffener 41.

Figure 3:
FIGS. 3 and 3A are cross-sectional and top views, respectively, of the structure with a paddle layer formed on the dielectric layer in accordance with an embodiment of the present invention.
Figure 3A:
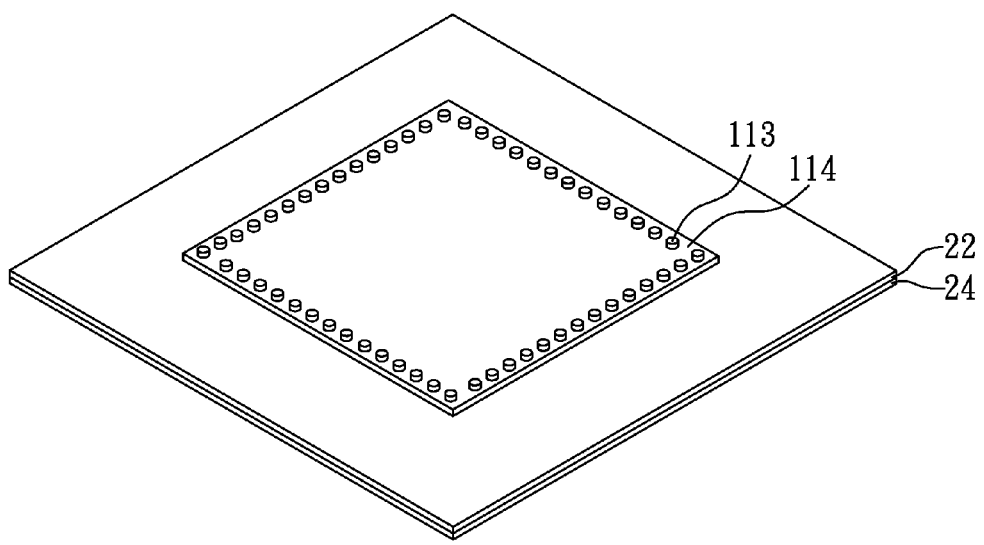

FIGS. 3 and 3A are cross-sectional and top views, respectively, of the structure with paddle layer 114 formed on dielectric layer 22. Paddle layer 114 can be formed by removing selected portions of metal layer 11 using photolithography and wet etching. Paddle layer 114 corresponds to the predetermined location for placing a semiconductor device and can serve as a heat spreader.

Figure 4:
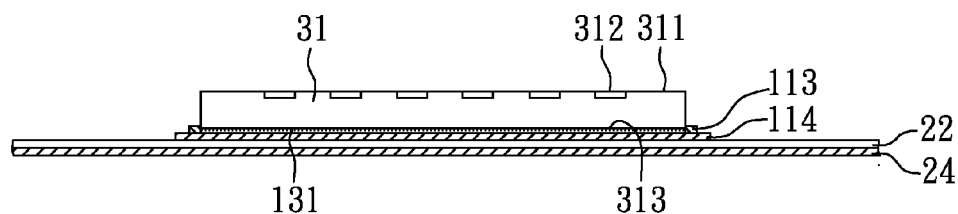
FIGS. 4 and 4A are cross-sectional and top views, respectively, of the structure with a semiconductor device mounted thereon in accordance with an embodiment of the present invention.
Figure 4A:
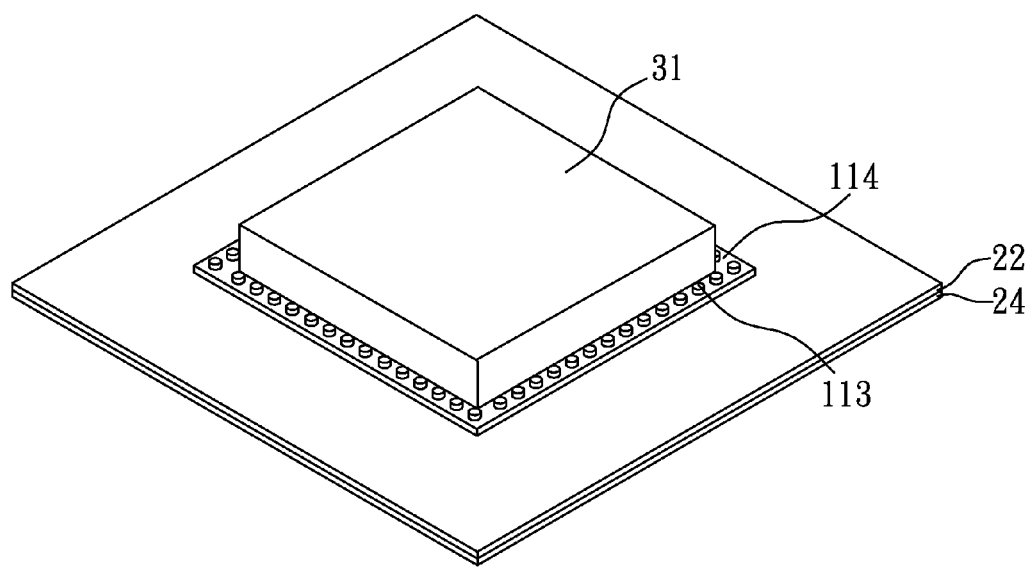

FIGS. 4 and 4A are cross-sectional and top views, respectively, of the structure with semiconductor device 31 such as a semiconductor chip mounted on paddle layer 114 using adhesive 131. Semiconductor device 31 includes active surface 311, inactive surface 313 opposite to active surface 311, and contact pads 312 at active surface 311.

Stopper 113 can serve as a placement guide for semiconductor device 31, and thus semiconductor device 31 is precisely placed at a predetermined location with its inactive surface 313 facing paddle layer 114. Stopper 113 extends from paddle layer 114 beyond inactive surface 313 of semiconductor device 31 in the upward direction and is laterally aligned with and laterally extends beyond four sides of semiconductor device 31 in the lateral directions. As stopper 113 is in close proximity to and conforms to four lateral surfaces of semiconductor device 31 in lateral directions and adhesive 131 under semiconductor device 31 is lower than stopper 113, any undesirable movement of semiconductor device 31 due to adhesive curing can be avoided. Preferably, a gap in between semiconductor device 31 and stopper 113 is in a range of about 0.001 to 1 mm.

Figure 5:
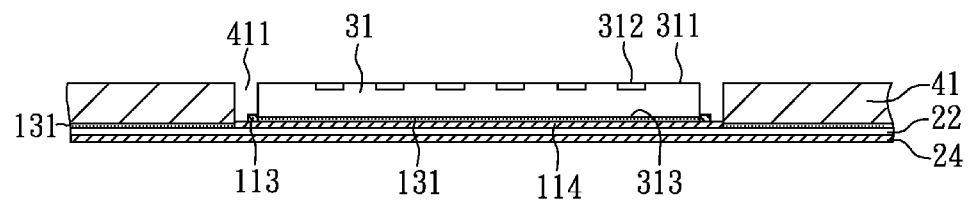
FIGS. 5 and 5A are cross-sectional and top views, respectively, of the structure with a stiffener mounted thereon in accordance with an embodiment of the present invention.
Figure 5A:
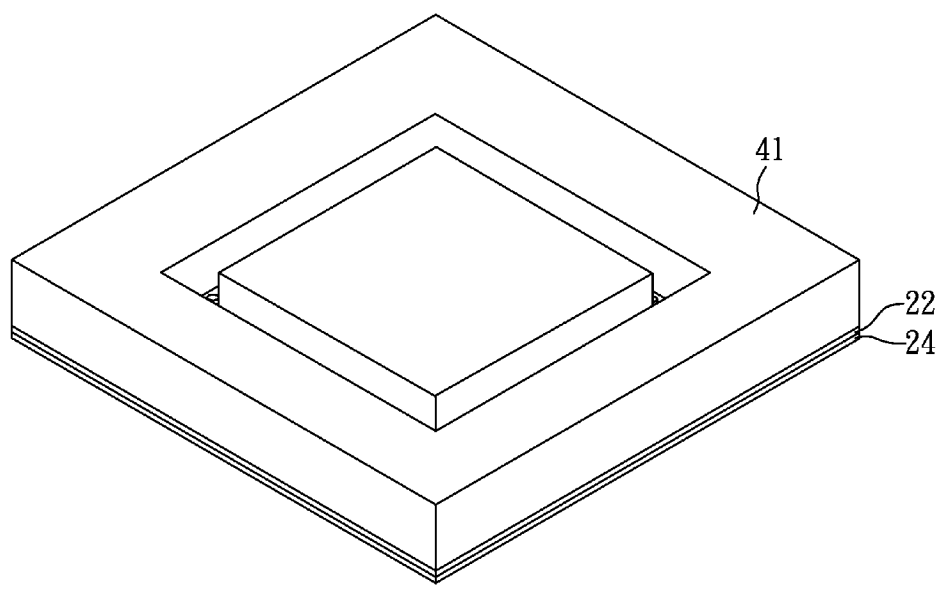

FIGS. 5 and 5A are cross-sectional and top views, respectively, of the structure with stiffener 41 mounted on dielectric layer 22 using adhesive 131. Semiconductor device 31, stopper 113 and paddle layer 114 are aligned with and inserted into aperture 411 of stiffener 41, and stiffener 41 is mounted on exposed dielectric layer 22 using adhesive 131. In this illustration, the peripheral edges of paddle layer 114 is in close proximity to and laterally aligned with four inner walls of aperture 411 and adhesive 131 under stiffener 41 is lower than paddle layer 114, and thus any undesirable movement of stiffener 41 also can be avoided before adhesive 131 is fully cured. Alternatively, in some embodiments, stiffener 41 may be attached on exposed dielectric layer 22 as wall as selected portions of paddle layer 114 that laterally extend beyond the area underneath semiconductor device 31, and undesirable movement of stiffener 41 is blocked by stopper 113 that is higher than adhesive 131 underneath stiffener 41 and is in close proximity to and laterally aligned with four inner walls of aperture 411.

Aperture 411 is formed by mechanical drilling through stiffener 41 and can be formed with other techniques such as punching and laser cutting. Stiffener 41 is illustrated as an epoxy sheet and is substantially coplanar with semiconductor device 31 in the upward direction. The stiffener 41 can be other insulating layer such as glass, ceramic or multi-layer laminate structures, such as a multi-layer circuit board. Optionally, a bonding material (not shown in the figure) can be added between semiconductor device 31 and stiffener 41 to enhance rigidity.

Figure 6:
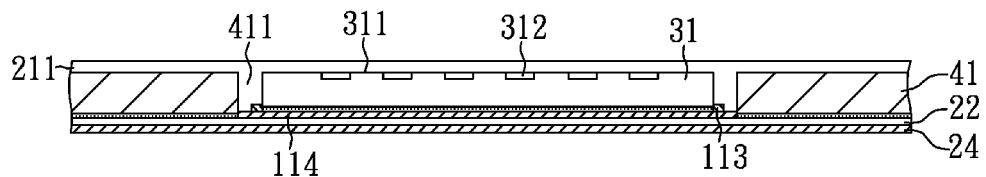
FIGS. 6-8 are cross-sectional views showing a method of making an interconnect substrate that includes a semiconductor device, a stiffener, a stopper, dual build-up circuitries, a plated through-hole, and a paddle layer spaced from the peripheral edges of the substrate in accordance with an embodiment of the present invention.

FIG. 6 is a cross-sectional view of the structure with first insulating layer 211 formed on active surface 311 of semiconductor device 31 and stiffener 41 in the upward direction. First insulating layer 211 covers semiconductor device 31, stiffener 41, stopper 113 and paddle layer 114 in the upward direction, and extends into the gap between semiconductor device 31 and stiffener 41 in aperture 411. First insulating layer 211 can be epoxy resin, glass-epoxy, polyimide and the like deposited by numerous techniques including film lamination, spin coating, roll coating, and spray-on deposition and typically has a thickness of 50 microns. Preferably, first insulating layer 211 and dielectric layer 22 are the same material.

Figure 7:
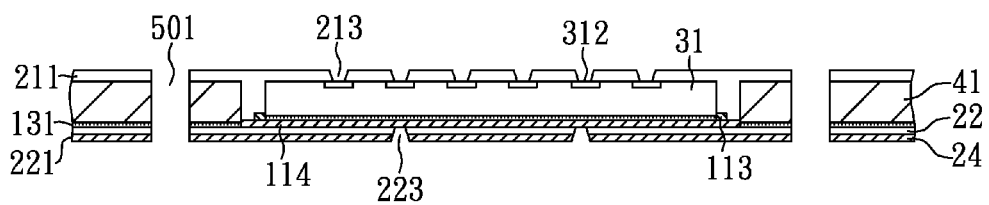

FIG. 7 is a cross-sectional view of the structure provided with first via openings 213, second via openings 223 and through-holes 501. First via openings 213 extend through first insulating layer 211 to expose contact pads 312 of semiconductor device 31. Second via openings 223 extend through support plate 24 and dielectric layer 22 to expose selected portions of paddle layer 114. Through-holes 501 extend through first insulating layer 211, stiffener 41, adhesive 131, dielectric layer 22 and support plate 24 in the vertical direction. If necessary, support plate 24 may be thinned down a little bit, for example down to about 15 microns, before forming first and second via openings 213, 223 and through-holes 501.

First and second via openings 213, 223 may be formed by numerous techniques including laser drilling, plasma etching and photolithography. Laser drilling can be enhanced by a pulsed laser. Alternatively, a scanning laser beam with a metal mask can be used. In forming second via openings 223, copper can be etched first to create a metal window followed by laser. Through-holes 501 are formed by mechanical drilling and can be formed by other techniques such as laser drilling and plasma etching with or without wet etching. First and second via openings 213, 223 typically have a diameter of 50 microns, and dielectric layer 22 is considered second insulating layer 221 of build-up circuitry.

Referring now to FIG. 8, first conductive traces 231 are formed on first insulating layer 211 by depositing plated layer 24' on first insulating layer 211 and into first via openings 213, and then patterning plated layer 24'. Meanwhile, second conductive traces 241 are formed on second insulating later 221 by depositing plated layer 24' on support plate 24 and then patterning support plate 24 as well as plated layer 24' thereon. Alternatively, in some embodiments which apply a laminate substrate without support plate 24 or remove support plate 24 after the step illustrated in FIG. 6, the dielectric layer 22 can be directly metallized to form second conductive traces 241 after forming second via openings 223 and through-holes 501. Also, plated layer 24' is further deposited as a connecting layer on the inner wall of through-holes 501 to provide plated through holes 502.

Plated layer 24' can be deposited by numerous techniques including electroplating, electroless plating, evaporating, sputtering, and their combinations as a single layer or multiple layers. For instance, plated layer 24' is deposited by first dipping the structure in an activator solution to render the insulating layer catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, support plate 24 and/or plated layer 24' can be patterned to form first conductive traces 231 and second conductive traces 241 by numerous techniques including wet etching, electro-chemical etching, laser-assist etching, and their combinations with an etch mask (not shown) thereon that defines first conductive traces 231 and second conductive traces 241, respectively.

Support plate 24 and plated layer 24' thereon are shown as a single layer for convenience of illustration. The boundary (shown in phantom) between the metal layers may be difficult or impossible to detect since copper is plated on copper. However, the boundary between plated layer 24' and first insulating layer 211, between plated layer 24' and second insulating layer 221, and between plated layer 24' and stiffener 41 is clear.

Accordingly, as shown in FIG. 8, interconnect substrate 101 is accomplished and includes semiconductor device 31, stopper 113, stiffener 41, paddle layer 114, dual build-up circuitries 201, 202 and plated through-holes 502. In this illustration, first build-up circuitry 201 includes first insulating layer 211 and first conductive traces 231, while second build-up circuitry 202 includes second insulating layer 221 and second conductive traces 241. Paddle layer 114 is sandwiched between inactive surface 313 of semiconductor device 31 and second build-up circuitry 202. Stopper 113 extends from paddle layer 114 and extends beyond inactive surface 313 of semiconductor device 31 in the upward direction to accurately confine the placement location of semiconductor device 31. First conductive traces 231 extend from first insulating layer 211 in the upward direction, extend laterally on first insulating layer 211 and extend into first via openings 213 in the downward direction to form first conductive vias 233 in electrical contact with contact pads 312, thereby providing signal routing for semiconductor device 31. Second conductive traces 241 extend from second insulating layer 221 in the downward direction, extend laterally on second insulating layer 221 and extend into second via openings 223 in the upward direction to form second conductive vias 243 in electrical contact with paddle layer 114, thereby providing thermally conductive pathway for semiconductor device 31. Plated through-holes 502 extend through stiffener 41 in the vertical directions to provide electrical connection between first conductive traces 231 and second conductive traces 241.

Figure 9:
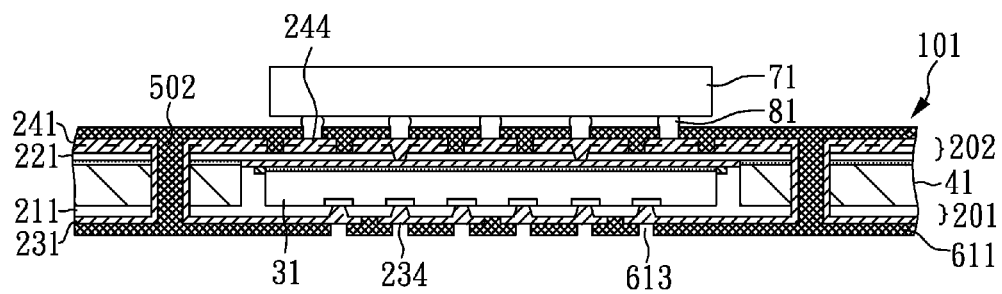
FIG. 9 is a cross-sectional view of a three dimensional stacked semiconductor assembly that includes an interconnect substrate with an embedded semiconductor device and another semiconductor device electrically connected to the build-up circuitry of the interconnect substrate through solder bumps in accordance with an embodiment of the present invention.

FIG. 9 is a cross-sectional view of a three-dimensional semiconductor assembly in which another semiconductor device 71 is attached to the interconnect substrate 101 at second build-up circuitry 202 via solder bumps 81 on second interconnect pads 244 exposed by solder mask material 611. In this illustration, solder mask material 611 is disposed over first build-up circuitry 201 and second build-up circuitry 202, fills the remaining space in plated through-holes 502 and includes solder mask openings 613 that are aligned with first and second interconnect pads 234, 244. External semiconductor device 71 can be electrically connected to the embedded semiconductor device 31 through second build-up circuitry 202, plated through-hole 502 and first build-up circuitry 201. Additionally, first interconnect pads 234 of first build-up circuitry 201 can accommodate a conductive joint, such as solder bump, solder ball, pin and the like for electrical communication and mechanical attachment with external components or a PCB. Herein, solder mask openings 613 may be formed by numerous techniques including photolithography, laser drilling and plasma etching, and solder bumps 81 can be provided by numerous techniques including screen printing solder paste followed by a reflow process or by electroplating.

Embodiment 2

Figure 10:
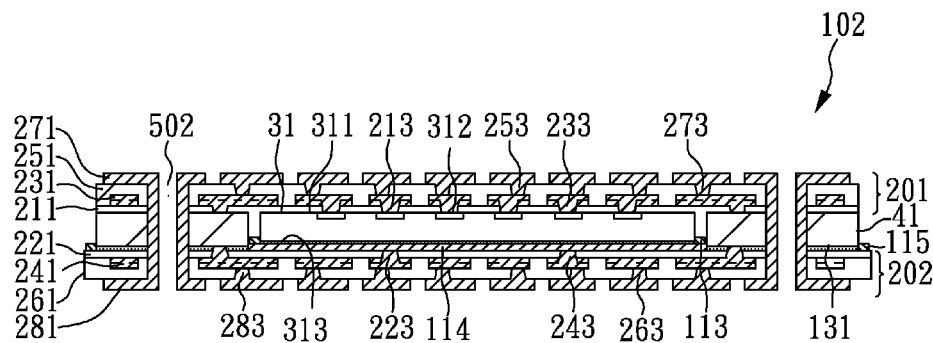
FIGS. 10 and 10A are cross-sectional and top views, respectively, of another interconnect substrate that includes a semiconductor device, a stopper, a placement guide, a stiffener, a paddle layer, dual build-up circuitries and a plated through-hole in accordance with another embodiment of the present invention.
Figure 10A:
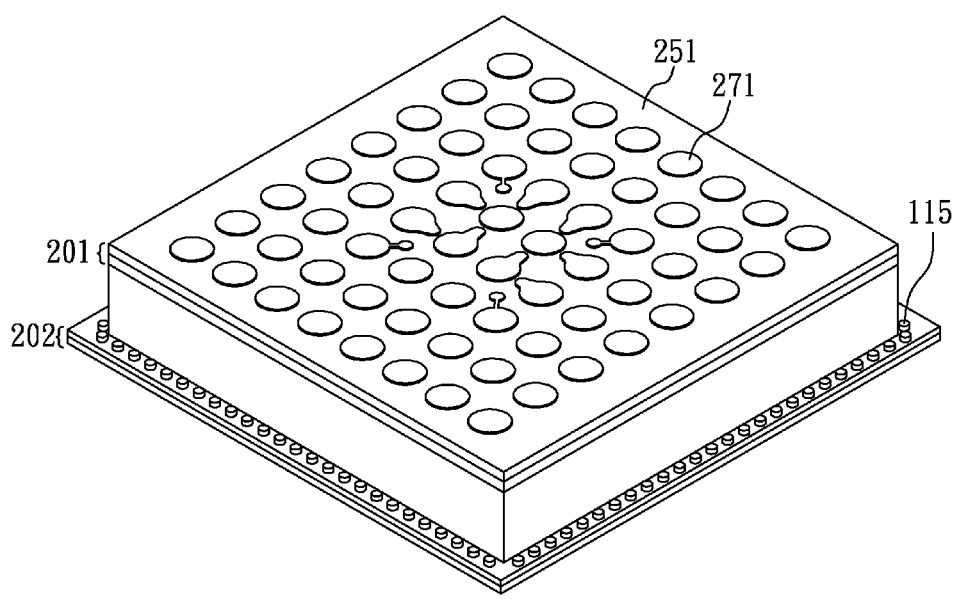

FIGS. 10 and 10A are cross-sectional and top views, respectively, of another interconnect substrate 102 with placement guide 115 in close proximity to the outer peripheral edges of stiffener 41 and additional first and second conductive vias 233, 243 in direct contact with stiffener 41 in accordance with another embodiment of the present invention.

In this embodiment, interconnect substrate 102 is manufactured in a manner similar to that illustrated in Embodiment 1, except that placement guide 115 is simultaneously formed during paddle layer 114 formation by removing selected portions of metal layer 11 to accurately confine the placement location of stiffener 41 and additional first and second conductive vias 233, 243 are formed in direct contact with stiffener 41. Herein, first build-up circuitry 201 includes first insulating layer 211, first conductive traces 231, third insulating layer 251 and third conductive traces 271, while second build-up circuitry 202 includes second insulating layer 221, second conductive traces 241, fourth insulating layer 261 and fourth conductive traces 281. First conductive traces 231 extends from first insulating layer 211 in the upward direction and extends into first via openings 213 in the downward direction to form first conductive vias 233 in direct contact with contact pads 312 and stiffener 41, while second conductive traces 241 extends from second insulating layer 221 in the downward direction and extends into second via openings 223 in the upward direction to form second conductive vias 243 in direct contact with paddle layer 114 and stiffener 41. Third insulating layer 251 extends from and covers first insulating layer 211 and first conductive traces 231 in the upward direction, while fourth insulating layer 261 extends from and covers second insulating layer 221 and second conductive traces 241 in the downward direction. Third conductive traces 271 extends from third insulating layer 251 in the upward direction and extends into third via openings 253 in the downward direction to form third conductive vias 273 in direct contact with first conductive traces 231, while fourth conductive traces 281 extends from fourth insulating layer 261 in the downward direction and extends into fourth via openings 263 in the upward direction to form fourth conductive vias 283 in direct contact with second conductive traces 241. Plated through-holes 502 extend through third insulating layer 251, first insulating layer 211, stiffener 41, adhesive 131, second insulating layer 221 and fourth insulating layer 261 in the vertical directions to provide an electrical connection between third conductive traces 271 and fourth conductive traces 281.

As shown in FIG. 10A, the placement location of stiffener 41 is accurately confined by placement guide 115 that extends from second insulating layer 221 beyond the attached surface of stiffener 41 in the upward direction and is laterally aligned with and laterally extends beyond four outer lateral surfaces of stiffener 41 in the lateral directions. Placement guide 115 is illustrated as plural metal posts and conforms to four outer sides of stiffener 41 in lateral directions. However, placement guide 115 is not limited to the illustrated pattern and can be designed in other various patterns. As placement guide 115 is in close proximity to and conforms to four outer lateral surfaces of stiffener 41 in lateral directions and adhesive 131 under stiffener 41 is lower than placement guide 115, any undesirable movement of stiffener 41 due to adhesive curing can be avoided. Preferably, a gap in between the outer peripheral edges of stiffener 41 and placement guide 115 is in a range of about 0.001 to 1 mm.

Embodiment 3

FIGS. 11-17 are cross-section views showing a method of making yet another interconnect substrate with the paddle layer laterally extending to peripheral edges of the substrate in accordance with yet another embodiment of the present invention.

For purposes of brevity, any description in Embodiment 1 is incorporated herein insofar as the same is applicable, and the same description need not be repeated.

Figure 11:
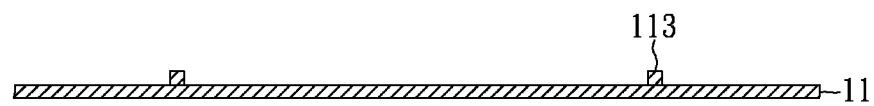
FIGS. 11-17 are cross-sectional views showing a method of making yet another interconnect substrate that includes a semiconductor device, a stiffener, a stopper, dual build-up circuitries, a plated through-hole, and a paddle layer extending to the peripheral edges of the substrate in accordance with yet another embodiment of the present invention.
Figure 12:
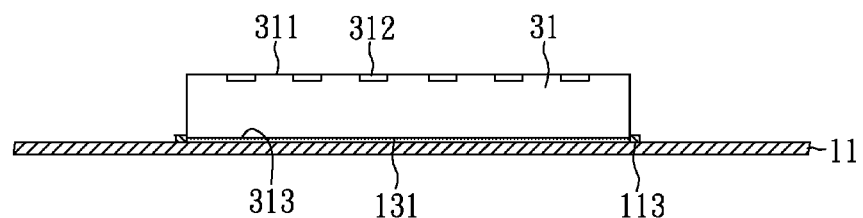

FIG. 11 is a cross-sectional view of the structure with stopper 113 formed on metal layer 11. The pattern of stopper 113 is not particularly limited as long as undesirable movement of the subsequently disposed semiconductor device can be avoided. For instance, stopper 113 can be designed in any pattern as illustrated in FIGS. 2A-2F to serve as a placement guide for the semiconductor device and block the undesirable movement of the semiconductor device. FIG. 12 is a cross-sectional view of the structure with semiconductor device 31 mounted on metal layer 11 using adhesive 131. Semiconductor device 31 includes active surface 311 with contact pads 312 thereon and inactive surface 313, and is attached onto metal layer 11 with its inactive surface 313 facing metal layer 11. Stopper 113 extends from metal layer 11 and extends beyond inactive surface 313 of semiconductor device 31 in the upward direction, and thus semiconductor device 31 can be precisely confined at a predetermined location.

Figure 13:
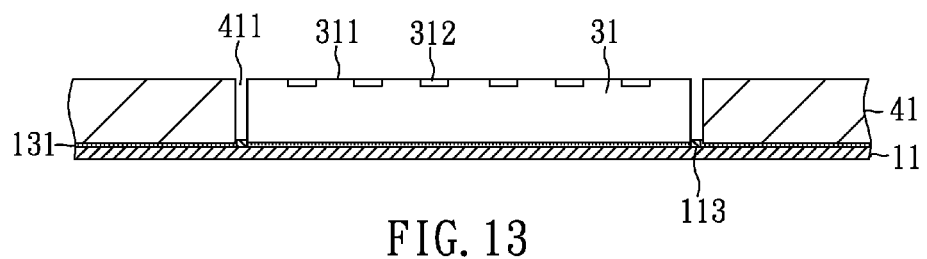

FIG. 13 is a cross-sectional view of the structure with stiffener 41 mounted on metal layer 11 using adhesive 131. Semiconductor device 31 and stopper 113 are aligned with and inserted into aperture 411 of stiffener 41, and the inner wall of aperture 411 is spaced from semiconductor device 31 by stopper 113. Stopper 113 is in close proximity to and laterally aligned with four inner walls of aperture 411 and adhesive 113 under stiffener 41 is lower than stopper 113, and thus any undesirable movement of stiffener 41 also can be avoided before adhesive 131 is fully cured.

Figure 14:
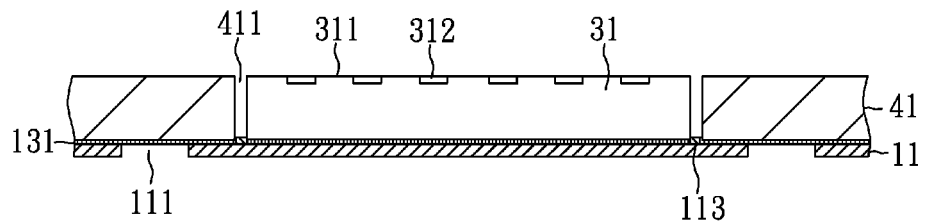

Subsequently, as shown in FIG. 14, openings 111 are formed through metal layer 11 at predetermined locations for subsequent formation of plated through-holes.

Figure 15:
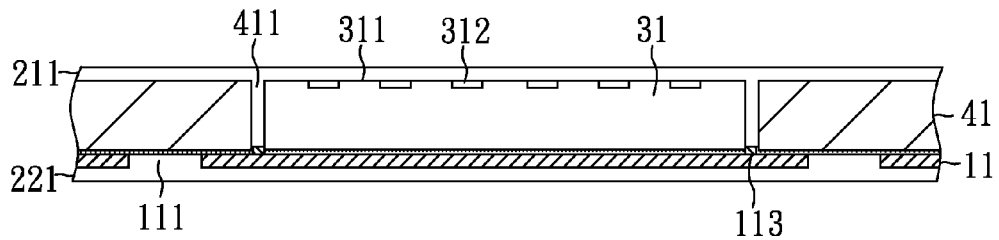

FIG. 15 is a cross-sectional view of the structure provided with first insulating layer 211 and second insulating layer 221. First insulating layer 211 covers semiconductor device 31, stiffener 41 and stopper 113 in the upward direction, and extends into the gap between semiconductor device 31 and stiffener 41 in aperture 411. Second insulating layer 221 covers metal layer 11 in the downward direction, and fills openings 111 in metal layer 11.

Figure 16:
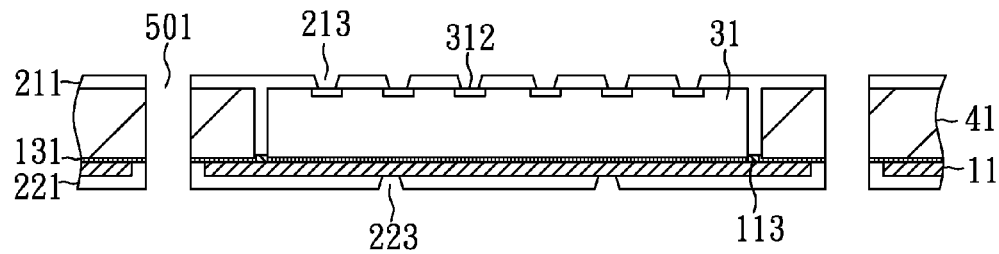

FIG. 16 is a cross-sectional view of the structure provided with first via openings 213, second via openings 223 and through-holes 501. First via openings 213 extend through first insulating layer 211 and are aligned with contact pads 312 of semiconductor device 31. Second via openings 223 extend through second insulating layer 221 and are aligned with selected portions of metal layer 11. Through-holes 501 correspond to and are axially aligned with and concentrically positioned within openings 111 in metal layer 11, and extend through first insulating layer 211, stiffener 41, adhesive 131 and second insulating layer 221 in the vertical direction.

Figure 17:
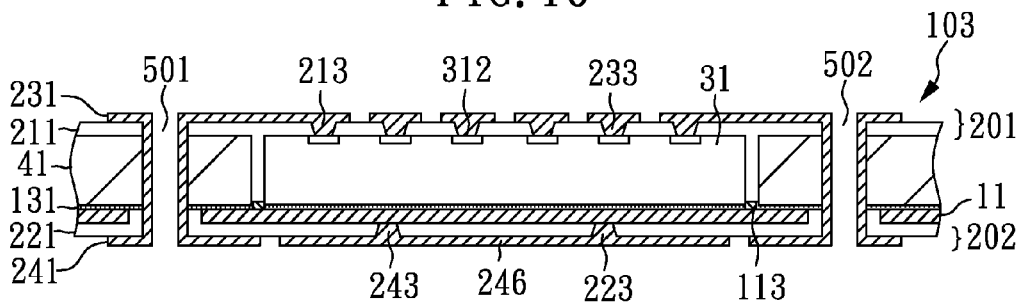

Referring now to FIG. 17, first conductive traces 231 and second conductive traces 241 with die paddle 246 are respectively formed on first and second insulating layers 211, 221 by metal deposition and patterning. Also, a connecting layer is deposited on the inner wall of through-holes 501 to provide plated through-holes 502. Accordingly, interconnect substrate 103 is accomplished and includes semiconductor device 31, stopper 113, stiffener 41, metal layer 11, dual build-up circuitries 201, 202 and plated through-holes 502. In this illustration, first build-up circuitry 201 includes first insulating layer 211 and first conductive traces 231, while second build-up circuitry 202 includes second insulating layer 221 and second conductive traces 241 with die paddle 246. Metal layer 11 is used as a paddle layer for device attachment and laterally extends from the area underneath semiconductor device 31 to peripheral edges of interconnect substrate 103. Stopper 113 extends from metal layer 11 and extends beyond inactive surface 313 of semiconductor device 31 in the upward direction to accurately confine the placement location of semiconductor device 31. First conductive traces 231 extend from first insulating layer 211 in the upward direction, extend laterally on first insulating layer 211 and extend into via openings 213 in the downward direction to form first conductive vias 233 in electrical contact with contact pads 312, thereby providing signal routing for semiconductor device 31. Second conductive traces 241 with die paddle 246 extend from second insulating layer 221 in the downward direction, extend laterally on second insulating layer 221 and extend into second via openings 223 in the upward direction to form second conductive vias 243 in electrical contact with metal layer 11, thereby providing thermally conductive pathway for semiconductor device 31. Plated through holes 502 extend through stiffener 41 in the vertical directions to provide electrical connection between first conductive traces 231 and second conductive traces 241.

Figure 18:
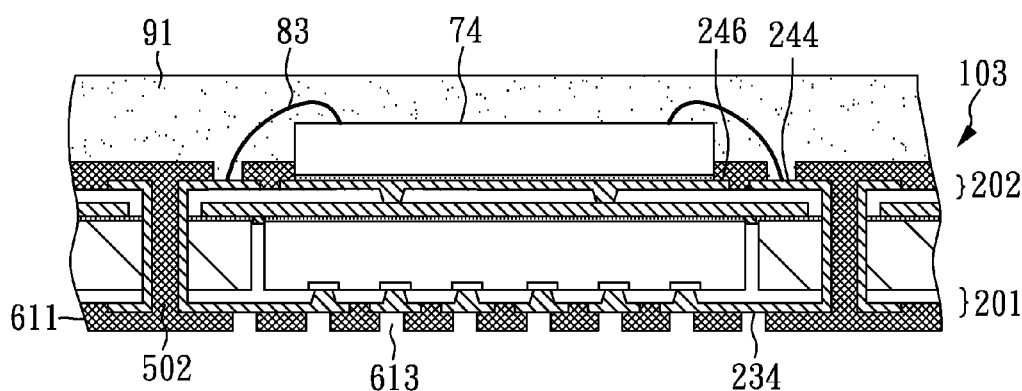
FIG. 18 is a cross-sectional view of another three dimensional stacked semiconductor assembly that includes an interconnect substrate with an embedded semiconductor device and another semiconductor device electrically connected to the build-up circuitry of the substrate through wire bonds in accordance with another embodiment of the present invention.

FIG. 18 is a cross-sectional view of a three-dimensional semiconductor assembly in which another semiconductor device 74 is attached to interconnect substrate 103 at die paddle 246 of second build-up circuitry 202 and is electrically connected to second conductive traces 241 via wire bonds 83. In this illustration, solder mask material 611 is disposed over first build-up circuitry 201 and second build-up circuitry 202, fills the remaining space in plated through-hole 502 and includes solder mask openings 613 that are aligned with first and second interconnect pads 234, 244 as well as selected portions of die paddle 246. Semiconductor device 74 on die paddle 246 can be electrically connected to the embedded semiconductor device 31 through wire bonds 83, second build-up circuitry 202, plated through-hole 502 and first build-up circuitry 201. Additionally, encapsulant 91 such as molding compound can be applied to protect semiconductor device 74 and wire bonds 83.

The interconnect substrates and three-dimensional semiconductor assemblies described above are merely exemplary. Numerous other embodiments are contemplated. In addition, the embodiments described above can be mixed-and-matched with one another and with other embodiments depending on design and reliability considerations. For instance, the interconnect substrate may include multiple sets of stoppers to accurately define the relative positions of multiple additional semiconductor devices, passive components or other electronic devices, and the build-up circuitry can include additional conductive traces to accommodate additional semiconductor devices, passive components or other electronic devices. Likewise, the stiffener can include multiple apertures to accommodate additional semiconductor devices, passive components or other electronic devices.

The semiconductor device can be a packaged or unpackaged chip. Furthermore, the semiconductor device can be a bare chip, LGA, or QFN, etc. The stopper can be customized for the semiconductor device. For instance, the stopper can have a pattern that defines a square or rectangular area with the same or similar topography as the semiconductor device.

The term "adjacent" refers to elements that are integral (single-piece) or in contact (not spaced or separated from) with one another. For instance, the first conductive trace is adjacent to the active surface but not the inactive surface.

The term "overlap" refers to above and extending within a periphery of an underlying element. Overlap includes extending inside and outside the periphery or residing within the periphery. For instance, in the position that the active surface of the semiconductor device faces the upward direction, the stiffener overlaps the metal layer since an imaginary vertical line intersects the stiffener and the metal layer, regardless of whether another element such as the adhesive is between the stiffener and the metal layer and is intersected by the line, and regardless of whether another imaginary vertical line intersects the metal layer but not the stiffener (within the aperture of the stiffener). Likewise, the adhesive overlaps the metal layer, the stiffener overlaps the adhesive and the adhesive is overlapped by the stiffener. Moreover, overlap is synonymous with over and overlapped by is synonymous with under or beneath.

The term "contact" refers to direct contact. For instance, the conductive trace contacts the active surface but not the inactive surface.

The term "cover" refers to incomplete and complete coverage in a vertical and/or lateral direction. For instance, in the position that the active surface of the semiconductor device faces the upward direction, the metal layer covers the semiconductor device in the downward direction regardless of whether another element such as the adhesive is between the semiconductor device and the metal layer, and the first build-up circuitry cover the semiconductor device in the upward direction.

The term "layer" refers to patterned and un-patterned layers. For instance, the metal layer of the laminate substrate can be an un-patterned blanket sheet before photolithography and wet etching. Furthermore, a layer can include stacked layers.

The terms "opening" and "aperture" and "hole" refer to a through hole and are synonymous. For instance, in the position that the active surface of the semiconductor device faces the upward direction, the semiconductor device is exposed by the stiffener in the upward direction when it is inserted into the aperture in the stiffener.

The term "inserted" refers to relative motion between elements. For instance, the semiconductor device is inserted into the aperture regardless of whether the stiffener is stationary and the semiconductor device moves towards the stiffener, the semiconductor device is stationary and the stiffener moves towards the semiconductor device or the semiconductor device and the stiffener both approach the other. Furthermore, the semiconductor device is inserted (or extends) into the aperture regardless of whether it goes through (enters and exits) or does not go through (enters without exiting) the aperture.

The phrase "aligned with" refers to relative position between elements regardless of whether elements are spaced from or adjacent to one another or one element is inserted into and extends into the other element. For instance, the stopper is laterally aligned with the semiconductor device since an imaginary horizontal line intersects the stopper and the semiconductor device, regardless of whether another element is between the stopper and the semiconductor device and is intersected by the line, and regardless of whether another imaginary horizontal line intersects the semiconductor device but not the stopper or intersects the stopper but not the semiconductor device. Likewise, the first via opening is aligned with the contact pads of the semiconductor device, and the semiconductor device and the stopper are aligned with the aperture.

The phrase "in close proximity to" refers to a gap between elements not being wider than the maximum acceptable limit. As known in the art, when the gap between the semiconductor device and the stopper is not narrow enough, the location error of the semiconductor device due to the lateral displacement of the semiconductor device within the gap may exceed the maximum acceptable error limit. Once the location error of the semiconductor device goes beyond the maximum limit, it is impossible to align the contact pad with a laser beam, resulting in the electrical connection failure between the semiconductor device and the build-up circuitry. According to the pad size of the semiconductor device, those skilled in the art can ascertain the maximum acceptable limit for a gap between the semiconductor device and the stopper through trial and error to prevent the electrical connection failure between the semiconductor device and the build-up circuitry. Thereby, the description "the stopper is in close proximity to the peripheral edges of the semiconductor device" means that the gap between the peripheral edges of the semiconductor device and the stopper is narrow enough to prevent the location error of the semiconductor device from exceeding the maximum acceptable error limit.

The phrase "mounted on" includes contact and non-contact with a single or multiple support element(s). For instance, the semiconductor device is mounted on the metal layer regardless of whether it contacts the metal layer or is separated from the metal layer by an adhesive.

The phrase "electrical connection" or "electrically connects" or "electrically connected" refers to direct and indirect electrical connection. For instance, the plated through-hole provides an electrical connection for first conductive trace regardless of whether it is adjacent to the first conductive trace or electrically connected to the first conductive trace by the third conductive trace.

The term "above" refers to upward extension and includes adjacent and non-adjacent elements as well as overlapping and non-overlapping elements. For instance, in the position that the active surface of the semiconductor device faces the upward direction, the stopper extends above, is adjacent to and protrudes from the metal layer.

The term "below" refers to downward extension and includes adjacent and non-adjacent elements as well as overlapping and non-overlapping elements. For instance, in the position that the active surface of the semiconductor device faces the upward direction, the metal layer extends below, is adjacent to and protrudes from the adhesive in the downward direction. Likewise, the metal layer extends below the semiconductor device even though it is not adjacent to the semiconductor device.

The "first vertical direction" and "second vertical direction" do not depend on the orientation of the interconnect substrate, as will be readily apparent to those skilled in the art. For instance, the active surface of the semiconductor device faces the first vertical direction and the inactive surface of the semiconductor device faces the second vertical direction regardless of whether the interconnect substrate is inverted. Likewise, the stopper is "laterally" aligned with the semiconductor device in a lateral plane regardless of whether the interconnect substrate is inverted, rotated or slanted. Thus, the first and second vertical directions are opposite one another and orthogonal to the lateral directions, and a lateral plane orthogonal to the first and second vertical directions intersects laterally aligned elements. Furthermore, the first vertical direction is the downward direction and the second vertical direction is the upward direction in the position that the active surface of the semiconductor device faces the downward direction, and the first vertical direction is the upward direction and the second vertical direction is the downward direction in the position that the active surface of the semiconductor device faces the upward direction.

The interconnect substrate and the semiconductor assembly using the same according to the present invention have numerous advantages. The interconnect substrate made by this method and the semiconductor assembly using the same are reliable, inexpensive and well-suited for high volume manufacture. The stiffener provides the mechanical support, dimensional stability and controls the overall flatness and the thermal expansion of the build-up circuitry such that the semiconductor device can be securely connected to the build-up circuitry under thermal cycling even though the coefficient of thermal expansion (CTE) between them may be different. The paddle layer can provide excellent heat spreading, thereby enhancing thermal performance. The direct electrical connection without solder between the semiconductor device and the build-up circuitry is advantageous to high I/O and high performance. Particularly, the stopper can accurately confine the placement location of the semiconductor device and avoid the electrical connection failure between the semiconductor device and the build-up circuitry resulted from the lateral displacement of the semiconductor device, thereby improving the manufacturing yield greatly.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional packaging techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

Although the present invention has been explained in relation to its preferred embodiment, it is to be understood that many other possible modifications and variations can be made without departing from the spirit and scope of the invention as hereinafter claimed.

What is claimed is:

1. A thermally enhanced interconnect substrate with an embedded device and a built-in stopper, comprising:
    a paddle layer;
    a semiconductor device that is mounted on the paddle layer from a first vertical direction and includes an active surface with a contact pad thereon and an inactive surface, wherein the active surface faces the first vertical direction and the inactive surface faces a second vertical direction opposite the first vertical direction and is attached to the paddle layer;
    an adhesive that contacts and is sandwiched between the semiconductor device and the paddle layer;
    the stopper that extends from the paddle layer in the first vertical direction and serves as a placement guide for the semiconductor device and is in close proximity to and laterally aligned with and laterally extends beyond peripheral edges of the semiconductor device in lateral directions orthogonal to the vertical directions;
    a stiffener that includes an aperture with the semiconductor device and the stopper extending thereinto;
    a first build-up circuitry that covers the stopper, the semiconductor device and the stiffener in the first vertical direction and includes a first insulating layer, a first via opening and a first conductive trace, wherein the first via opening in the first insulating layer is aligned with the contact pad of the semiconductor device, and the first conductive trace extends from the first insulating layer in the first vertical direction and extends through the first via opening in the second vertical direction and directly contacts the contact pad;
    a second build-up circuitry that covers the paddle layer and the stiffener in the second vertical direction and includes a second insulating layer, a second via opening and a second conductive trace, wherein the second via opening in the second insulating layer is aligned with the paddle layer, and the second conductive trace extends from the second insulating layer in the second vertical direction and extends through the second via opening in the first vertical direction; and
    a plated through-hole that extends through the stiffener in the vertical directions to provide an electrical connection between the first build-up circuitry and the second build-up circuitry.

2. The thermally enhanced interconnect substrate of claim 1, wherein an electrical connection between the semiconductor device and the first build-up circuitry is devoid of solder.

3. The thermally enhanced interconnect substrate of claim 1, wherein the stopper include a continuous or discontinuous strip or an array of posts.

4. The thermally enhanced interconnect substrate of claim 1, wherein a gap in between the semiconductor device and the stopper is in a range of 0.001 to 1 mm.

5. The thermally enhanced interconnect substrate of claim 1, wherein the stopper has a height in a range of 10 to 200 microns.

6. The thermally enhanced interconnect substrate of claim 1, wherein the stiffener is a laminated epoxy or polyimide.

* * * * *